(12) United States Patent
Kang et al.

(10) Patent No.: US 11,552,023 B2
(45) Date of Patent: Jan. 10, 2023

(54) PASSIVE COMPONENT EMBEDDED IN AN EMBEDDED TRACE SUBSTRATE (ETS)

(71) Applicant: QUALCOMM Incorporated, San Diego, CA (US)

(72) Inventors: Kuiwon Kang, San Diego, CA (US); Brigham Navaja, San Diego, CA (US); Marcus Hsu, San Diego, CA (US); Terence Cheung, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 5 days.

(21) Appl. No.: 16/913,288

(22) Filed: Jun. 26, 2020

(65) Prior Publication Data

US 2021/0407918 A1    Dec. 30, 2021

(51) Int. Cl.
| | |
|---|---|
| *H01L 23/538* | (2006.01) |
| *H01L 23/498* | (2006.01) |
| *H01L 23/522* | (2006.01) |
| *H01L 21/768* | (2006.01) |
| *H01L 21/48* | (2006.01) |
| *H01L 49/02* | (2006.01) |

(52) U.S. Cl.
CPC ...... *H01L 23/5389* (2013.01); *H01L 21/4857* (2013.01); *H01L 21/76897* (2013.01); *H01L 23/49816* (2013.01); *H01L 23/5223* (2013.01); *H01L 23/5226* (2013.01); *H01L 28/40* (2013.01)

(58) Field of Classification Search
CPC ........... H01L 21/4857; H01L 21/67897; H01L 23/5389; H01L 23/49816; H01L 23/5223; H01L 23/5226; H01L 28/40
See application file for complete search history.

(56) References Cited

U.S. PATENT DOCUMENTS

| | | | | |
|---|---|---|---|---|
| 2011/0216513 | A1* | 9/2011 | Lee | H05K 1/185 |
| | | | | 361/761 |
| 2016/0183379 | A1* | 6/2016 | Song | H01G 4/33 |
| | | | | 174/260 |
| 2018/0261569 | A1* | 9/2018 | Yang | H01L 25/50 |
| 2018/0350630 | A1* | 12/2018 | Kang | H01L 21/563 |
| 2020/0083176 | A1* | 3/2020 | Lim | H01L 23/5386 |
| 2020/0176417 | A1* | 6/2020 | Navaja | H05K 1/186 |

* cited by examiner

*Primary Examiner* — Jaehwan Oh
*Assistant Examiner* — John M Parker
(74) *Attorney, Agent, or Firm* — Patterson + Sheridan, LLP

(57) ABSTRACT

Certain aspects of the present disclosure generally relate to an embedded trace substrate (ETS) with one or more passive components embedded therein. Such an ETS may provide shorter routing, smaller loop area, and lower parasitics between a semiconductor die and a land-side passive component embedded in the ETS. One example embedded trace substrate generally includes a core, a first insulating material disposed above the core and having a first metal pattern embedded therein, a second insulating material disposed below the core and having a second metal pattern embedded therein, and one or more passive components embedded in the core.

16 Claims, 4 Drawing Sheets

PASSIVE COMPONENT EMBEDDED IN AN EMBEDDED TRACE SUBSTRATE (ETS)

BACKGROUND

Field of the Disclosure

Certain aspects of the present disclosure generally relate to electronic components and, more particularly, to embedding passive components in an embedded trace substrate (ETS).

Description of Related Art

A continued emphasis in semiconductor technology is to create improved performance semiconductor devices at competitive prices. This emphasis over the years has resulted in extreme miniaturization of semiconductor devices, made possible by continued advances in semiconductor processes and materials in combination with new and sophisticated device designs. Certain semiconductor packaging is formed through layer-by-layer buildup on one or both sides of a core (e.g., a central glass reinforced core material) to enable fine routing and act as an interposer between the semiconductor die and circuit board.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide advantages that include shorter routing and, thus, lower parasitics between a semiconductor die and a passive component embedded in an embedded trace substrate (ETS).

Certain aspects of the present disclosure are directed to an embedded trace substrate. The embedded trace substrate generally includes a core, a first insulating material disposed above the core and having a first metal pattern embedded therein, a second insulating material disposed below the core and having a second metal pattern embedded therein, and one or more passive components embedded in the core.

Certain aspects of the present disclosure are directed to a package assembly. The package assembly generally includes the embedded trace substrate described herein and an integrated circuit (IC) die disposed above and coupled to the embedded trace substrate.

Certain aspects of the present disclosure are directed to a method for fabricating an embedded trace substrate. The method generally includes disposing one or more passive components in a core, disposing a first insulating material above the core, the first insulating material having a first metal pattern embedded therein, and disposing a second insulating material below the core, the second insulating material having a second metal pattern embedded therein, such that the one or more passive components are embedded in the core.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure relate to embedding passive components in an embedded trace substrate (ETS) and techniques for fabricating the same. Such an ETS may provide shorter routing, smaller loop area, and lower parasitics between a semiconductor die and a land-side passive component embedded in the ETS.

Example Chip Package with an Embedded Trace Substrate

Figure 1:
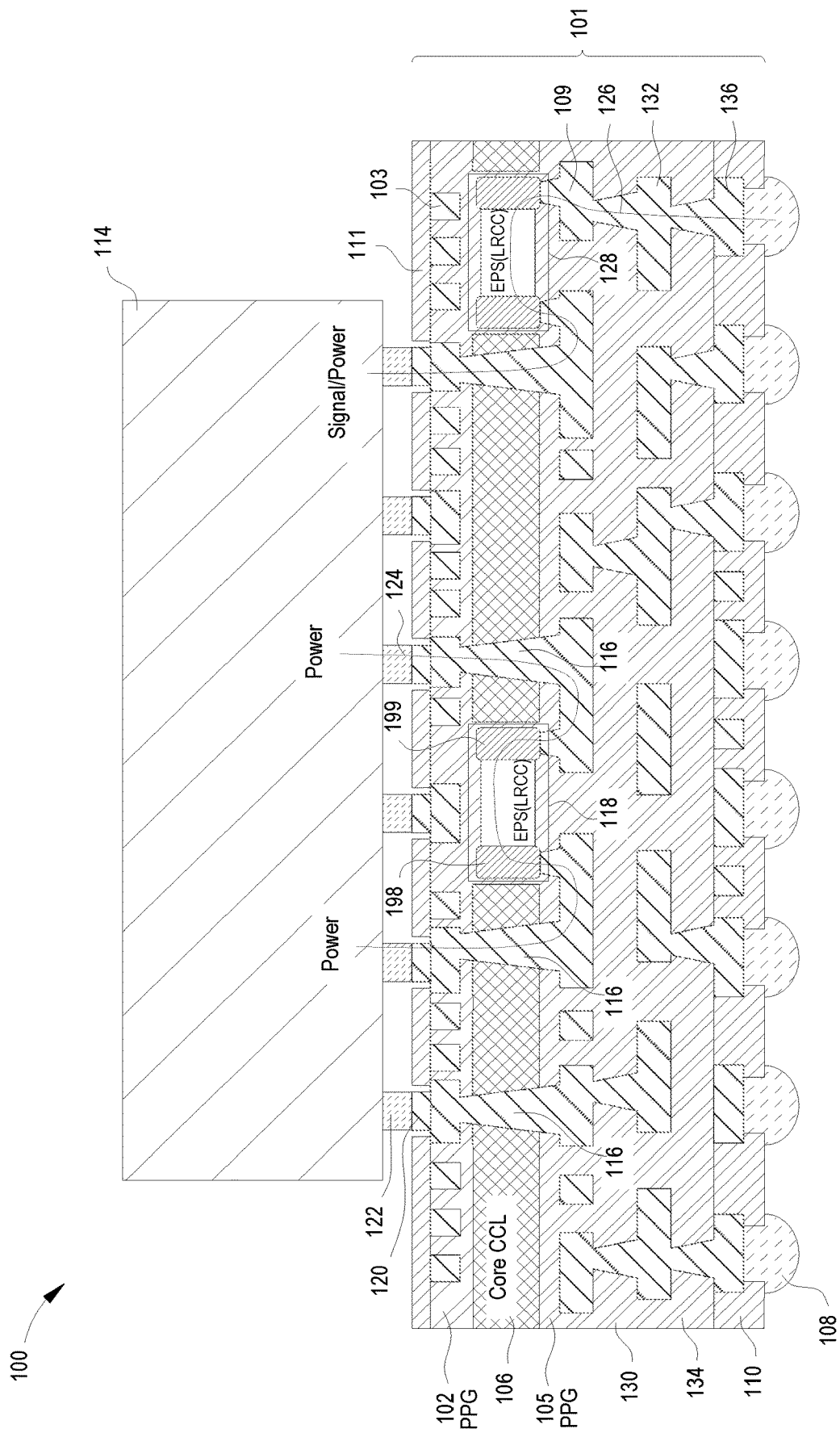
FIG. 1 is a cross-sectional view of an example chip package with an embedded trace substrate having passive components embedded therein, in accordance with certain aspects of the present disclosure.

FIG. 1 is a cross-sectional view of an example chip package 100, in accordance with certain aspects of the present disclosure. As shown, the chip package 100 may include a semiconductor die 114 disposed above an embedded trace substrate (ETS) 101. The die 114 may be implemented as any desired integrated circuit (IC) die for the chip package 100. Although only one die 114 is illustrated in FIG. 1, it is to be understand that that there may be more than one die disposed above the ETS 101, and the multiple dies may be disposed in one or more layers (e.g., vertically stacked).

The chip package 100 may be implemented as a chip scale package, such as a wafer level chip scale package having a package size that is near the die size. For certain aspects, a chip scale package may have package size that is less than or equal to 1.2 times the size of the die and surface mountable. The chip package 100 may be used to package various electronic circuits, such as a system on a chip (SoC), a modem, a radio frequency front-end (RFFE) circuit, memory, a general purpose processor, a digital signal processor (DSP), an image processor, a graphics processing unit (GPU), a central processing unit (CPU), an application specific integrated circuit (ASIC), a field programmable gate array (FPGA) or other programmable logic device (PLD), discrete gate or transistor logic, discrete hardware components, any suitable semiconductor device, or any combination thereof.

The ETS 101 may include a core 106, which may be composed of a copper clad laminate (CCL), woven glass, and/or any other suitable material. The core 106 may have a thickness ranging from 30 to 100 µm, for example. As shown, one or more passive devices 118, 128 may be disposed within the core 106 of the ETS 101. More specifically, the passive devices may be disposed within cavities 119, 121 in the core 106. As illustrated in FIG. 1, the cavities 119, 121 may traverse the height of the core 106. For other aspects, the cavities 119, 121 may traverse only a fraction of the height of the core 106. The one or more passive devices 118, 128 may include capacitors, (e.g., multilayer ceramic capacitors (MLCCs)), and/or inductors, for example. Although two passive devices 118, 128 are shown, the ETS 101 may include a single passive device or more than two passive devices.

The ETS 101 may include a first insulating material 102 disposed above the core 106 and a second insulating material 105 disposed below the core 106. For example, the first insulating material 102 and/or the second insulating material 105 may be composed of pre-impregnated (prepreg) material or any of various other suitable electrical insulative materials. The first insulating material 102 may include a plurality of traces 103 embedded therein and arranged in a first metal pattern (e.g., forming a first metal layer). The first insulating material may be used to laminate or otherwise affix the plurality of traces 103 to the top of the core 106. Similarly, the second insulating material 105 may include a plurality of traces 109 embedded therein and arranged in a second metal pattern (e.g., forming a second metal layer). The second insulating material 105 may be used to laminate or otherwise affix the plurality of traces 109 to the bottom of the core 106. With the first and second insulating materials 102, 105 disposed above and below the core 106, respectively, the passive devices 118, 128 are embedded in the ETS 101 (and more specifically, are embedded in the core 106 of the ETS). The traces in the ETS 101 may comprise copper (Cu), silver (Ag), gold (Au), or any other suitable electrically conductive material.

Additionally, the ETS 101 may include solder resist 111 disposed above the first insulating material 102 with solder 120 (e.g., formerly solder paste reflowed during manufacturing) disposed above and coupled to contacts of the first metal pattern in exposed areas of the solder resist 111. In certain aspects, vias 116 may couple some of the traces 103 to some of the traces 109, as shown. For example, the two terminals 198, 199 of the embedded passive device 118 may be coupled to two of the traces 109, which in turn may be coupled to two of the traces 103 by two of the vias 116. In certain aspects, such coupling may provide a path 124 for electrical current between the die 114 and the passive device 118 through the contacts 122 and solder 120. In certain aspects, the contacts 122 may be conductive pillars or conductive balls composed of copper (Cu) or any other suitable metal. As another example, the terminals of the embedded passive device 128 may be coupled to two of the traces 109, where one of the traces 109 may be coupled to one of the traces 103 by one of the vias 116, while another one of the traces 109 may be coupled to a lower metal layer, as further described below. In certain aspects, such coupling may provide a path 126 for electrical current between the die 114 and a circuit board on which the chip package 100 may be mounted, through the embedded passive device 128 and conductive contacts 108 disposed on the bottom of the ETS 101. The conductive contacts 108 may be solder bumps, for example, and may comprise any suitable electrically conductive material, such as copper.

For certain aspects, the ETS 101 may include additional metal layers below and/or above the metal layers surrounding the core 106 (e.g., below the traces 103 and 109). For example, the ETS 101 may include a third insulating material 130 disposed below the second insulating material 105. The third insulating material 130 may include a plurality of traces 132 embedded therein and arranged in a third metal pattern (e.g., forming a third metal layer). The third insulating material 130 may be used to laminate or otherwise affix the plurality of traces 132 to the bottom surface of the second insulating material 105. As illustrated in the example of FIG. 1, the ETS 101 may also include a fourth insulating material 134 disposed below the third insulating material 130. The fourth insulating material 134 may include a plurality of traces 136 embedded therein and arranged in a fourth metal pattern (e.g., forming a fourth metal layer). The fourth insulating material 134 may be used to laminate or otherwise affix the plurality of traces 136 to the bottom surface of the third insulating material 130. The third insulating material 130 and/or the fourth insulating material 134 may be composed of pre-impregnated (prepreg) material or any of various other suitable electrical insulative materials. In this manner, the ETS 101 may have two, three, four, or more metal layers.

The bottom of the ETS 101 may be covered with solder resist 110 with the contacts 108 intersecting the solder resist and being coupled to certain traces in the bottom metal layer (e.g., traces 136 of the fourth insulating material 134). As described above, the contacts 108 may be coupled (e.g., soldered) to a circuit board, such that the circuits of the chip package 100 may be electrically coupled to other circuits.

Example Fabrication of an ETS with an Embedded Passive Component

FIGS. 2A-21I illustrate cross-sectional views of example operations for fabricating an ETS with at least one passive component embedded therein.

Figure 2A:
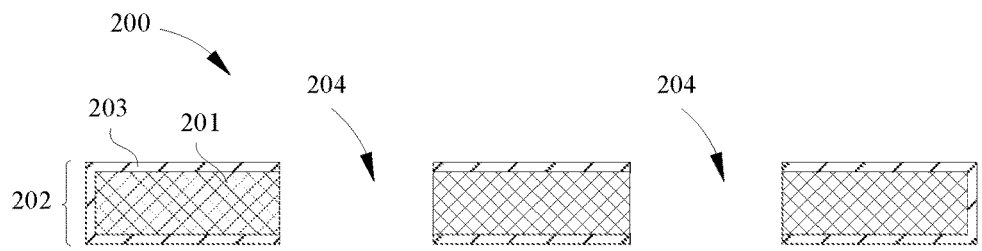
FIGS. 2A-2H illustrate cross-sectional views of example processes during fabrication of an embedded trace substrate having passive components embedded therein, in accordance with certain aspects of the present disclosure.

As shown in FIG. 2A, the workpiece 200 may begin as a core layer 202. For example, the core layer 202 may comprise a copper clad laminate (CCL), which may include a reinforcing material 201 covered with copper clad 203 on both sides. The reinforcing material 201 may include woven glass, for example. One or more cavities 204 may be formed in the core layer 202, using a laser, for example.

Figure 2B:
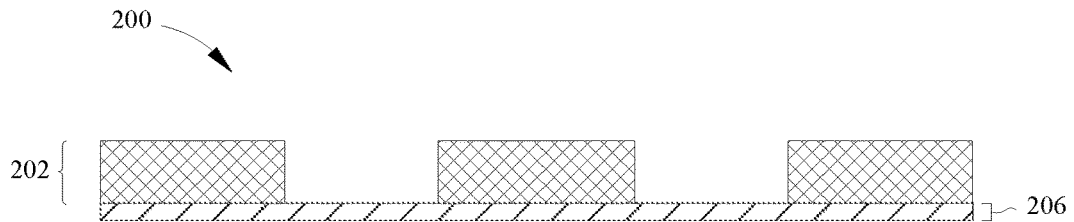

As depicted in FIG. 2B, a handle layer 206 may be formed below the core layer 202. The handle layer 206 may comprise a polyimide film, for example. In this case, the polyimide film may be laminated to one side (e.g., the bottom) of the core layer 202.

Figure 2C:
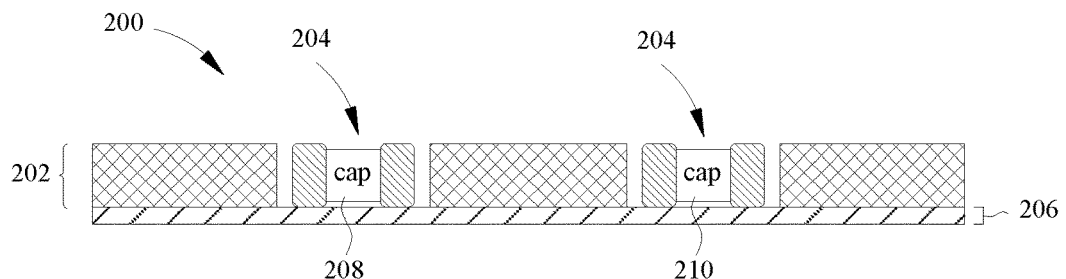

Continuing to FIG. 2C, components 208 and 210 may each be placed into one of the cavities 204 above the handle layer 206. The components 208 and 210 may be passive components, such as resistors, inductors, and/or capacitors. The components 208 and 210 may have heights less than or equal to the height of the core layer 202. In certain aspects, the thickness of the core layer 202 may be between 30 and 100 µm.

Figure 2D:
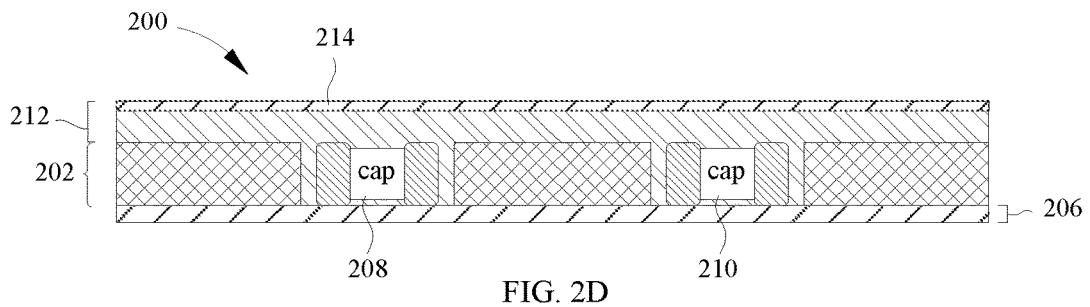

As shown in FIG. 2D, a laminate 212 may be disposed above the core layer 202 and the cavities 204 within which the components 208 and 210 are disposed. Furthermore, the laminate 212 may include a conductive layer 214 with a pattern of conductive traces. The conductive layer 214 may be composed of copper, silver, gold, or any other suitable material.

Figure 2E:
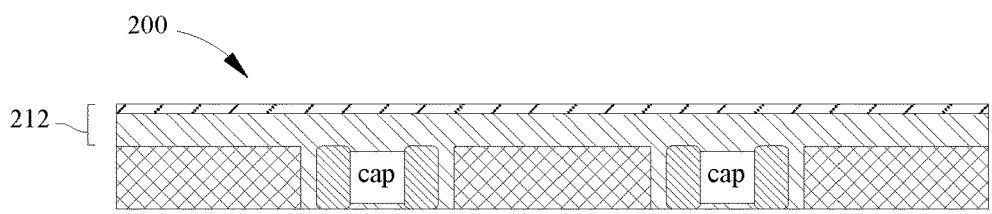

After the laminate 212 is applied to one side of the workpiece 200, the handle layer 206 may be removed, as depicted in FIG. 2E. In certain aspects, the handle layer 206 may be removed after the laminate 212 is sufficiently cured, such that the absence of the handle layer 206 does not hinder the integrity of the workpiece 200.

Figure 2F:
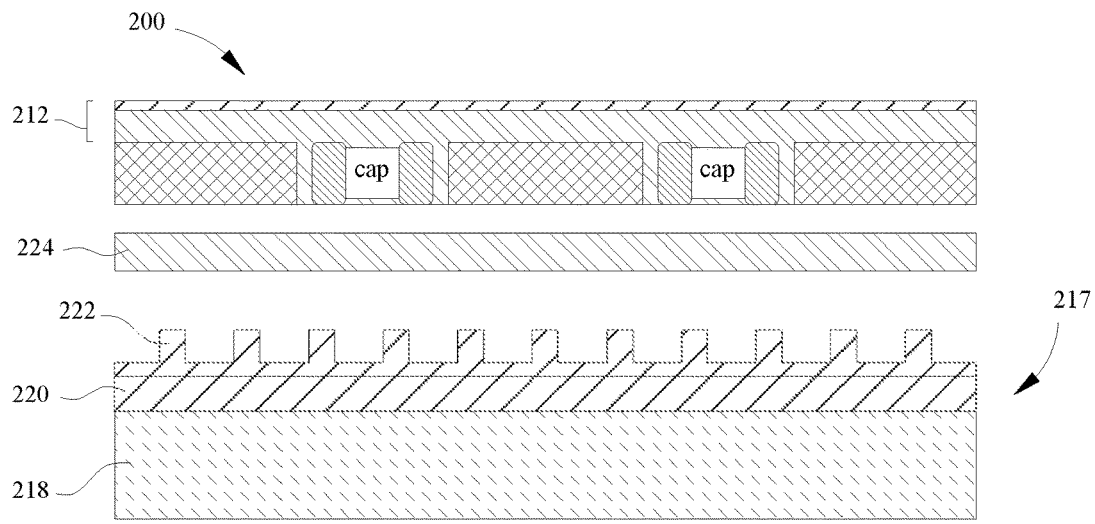

As shown in FIG. 2F, another laminate layer may be formed. The lay-up may include an insulating material 224 and another workpiece 217. The workpiece 217 may include a substrate 218, a sacrificial layer 220, and a metal layer 222. The metal layer 222 may already have a metal pattern formed therein, as illustrated. For example, the metal layer 222 may include multiple pads spaced apart along the metal layer 222, with some of the pads having a greater width than other pads in the metal layer 222. In certain aspects, the insulating material 224 may comprise the same material as laminate 212. In other aspects, the insulating material 224 may comprise a different material than laminate 212.

Figure 2G:
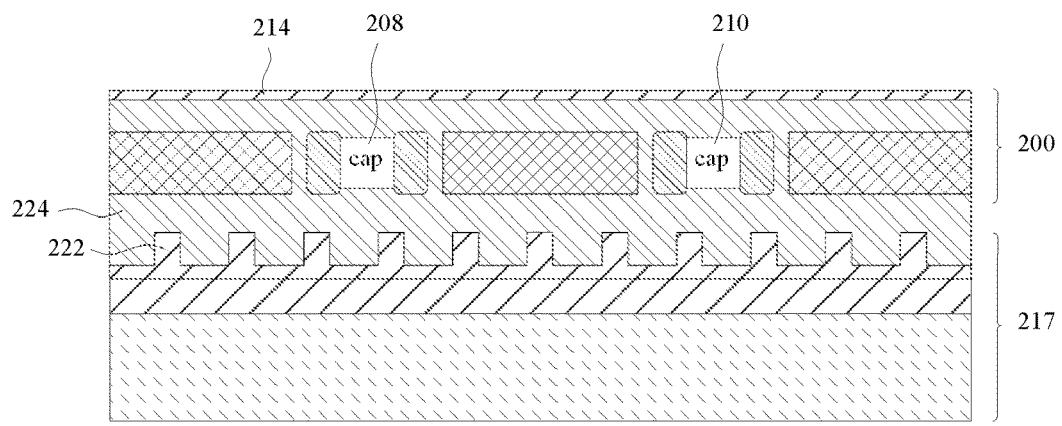

The workpiece 200, the insulating material 224, and the workpiece 217 may be combined, as depicted in FIG. 2G. For example, the metal layer 222 of the workpiece 217 may be pressed into the insulating material 224 and the bottom surface of the workpiece 200 while heating the insulating material, such that the workpiece 217 is laminated to the workpiece 200. In this manner, the insulating material 224 may cover the top of the metal layer 222, and the metal layer 222 and the insulating material 224 may be disposed below the core layer 202. Furthermore, vias (e.g., via 226) may be formed through the core layer 202 to electrically couple certain portions of the conductive layer 214 to certain portions of the metal layer 222.

Figure 2H:
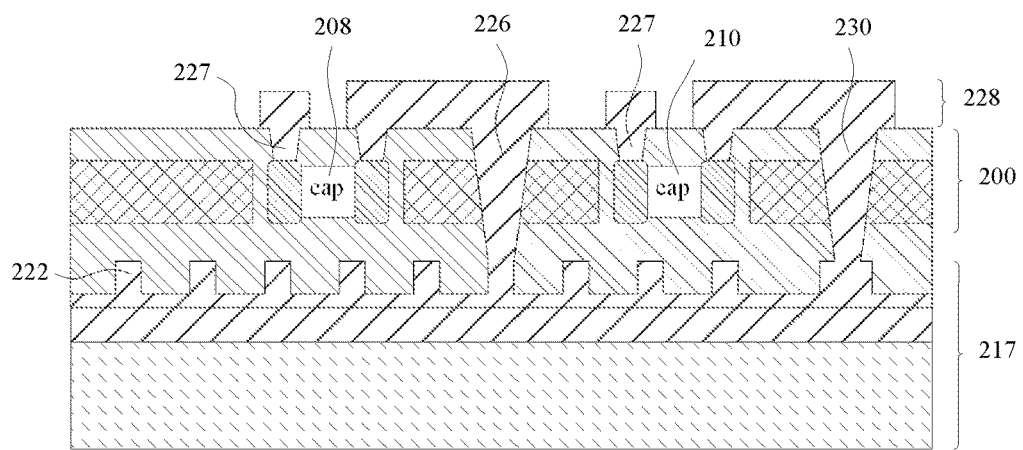

As illustrated in FIG. 2H, metal layer 228 may be patterned from conductive layer 214. For example, a plurality of contacts and traces may be formed above the laminate 212 to form the patterned metal layer 228. As shown, vias 226, 230 may be formed through the core layer 202 to electrically couple the metal layer 228 with the metal layer 222. Furthermore, conductive contacts (e.g., contacts 227) may be formed to electrically couple terminals of the embedded passive component (e.g., component 210) to the metal layer 228. For certain aspects, additional layers (e.g., insulating materials with patterned metal layers, such as the third and fourth insulating materials 130, 134) may be laminated above the combined workpiece. In certain aspects, the sacrificial layer 220 may be removed (e.g., by etched to remove the substrate 218 from the combined workpiece.

Figure 3:
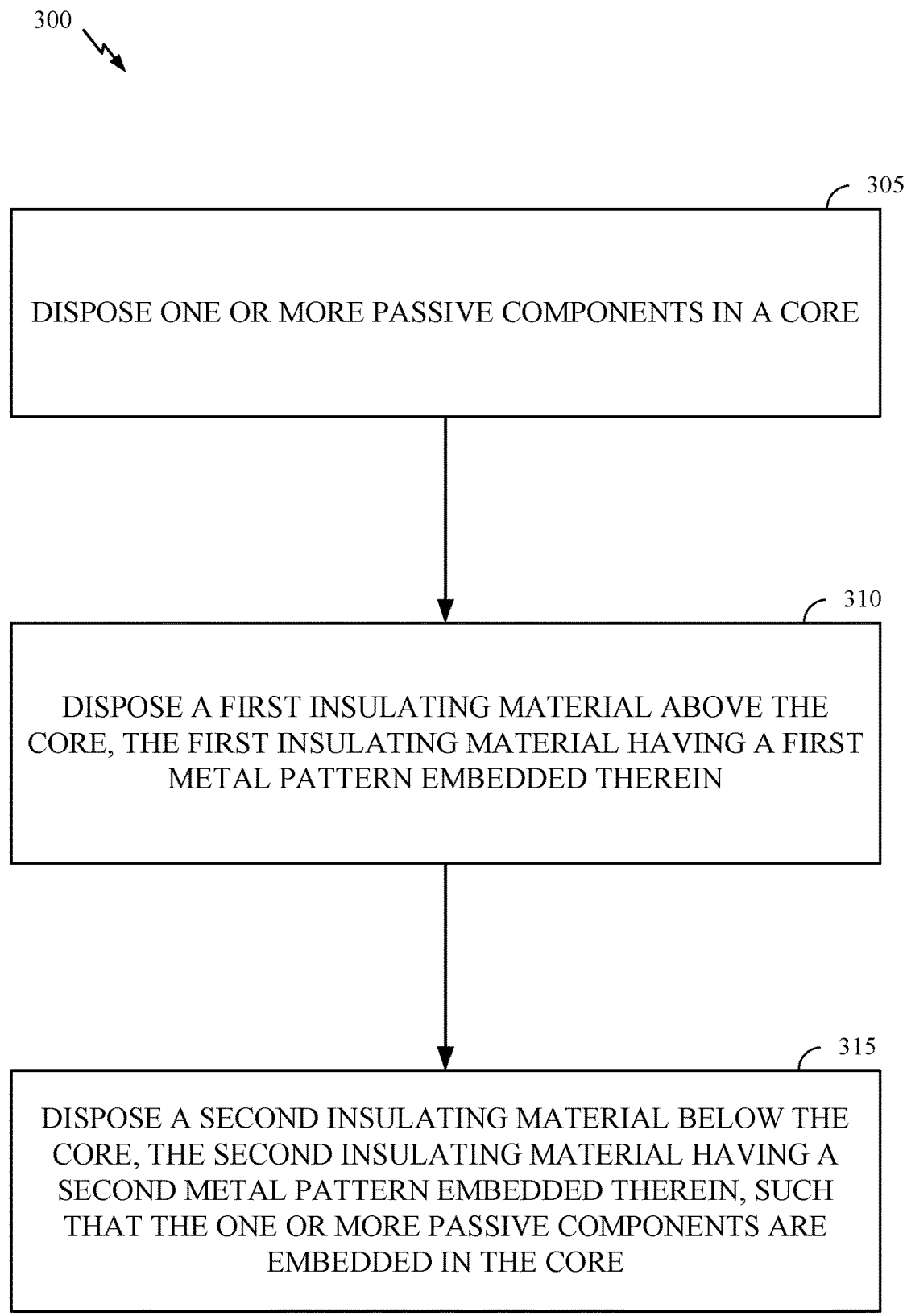
FIG. 3 is a flow diagram of example operations for fabricating an embedded trace substrate, in accordance with certain aspects of the present disclosure.

FIG. 3 is a block diagram of example operations 300 for fabricating an embedded trace substrate (e.g., the ETS 101 depicted in FIG. 1), in accordance with certain aspects of the present disclosure. The operations may be performed by a fabrication facility, for example.

The operations 300 may begin at block 305 with the facility disposing one or more passive components (e.g., the one or more passive devices 118, 128) in a core (e.g., the core 106).

At block 310, the facility disposes a first insulating material (e.g., the first insulating material 102) above the core. The first insulating material has a first metal pattern (e.g., the plurality of traces 103) embedded therein. In certain aspects, the facility laminates the first insulating material above the core.

At block 315, the facility disposes a second insulating material (e.g., the second insulating material 105) below the core. The second insulating material has a second metal pattern (e.g., the plurality of traces 109) embedded therein. With the first and second insulating materials disposed above and below the core, respectively, the one or more passive components are embedded in the embedded trace substrate (and more specifically, are embedded in the core of the embedded trace substrate). In certain aspects, the facility laminates the second insulating material below the core while pressing the second metal pattern into the second insulating material.

In certain aspects, the operations 300 may further involve the facility forming one or more cavities (e.g., the cavities 204) in the core. In this case, disposing the one or more passive components in the core at block 305 may entail disposing the one or more passive components in the one or more cavities formed in the core.

In certain aspects, the operations 300 may further involve the facility applying a handling film (e.g., handle layer 206) to a surface of the core after forming the one or more cavities. In this case, the facility may remove the handling film after disposing the one or more passive components in the one or more cavities at block 305 and after disposing the first insulating material above the core at block 310.

In certain aspects, the operations 300 further include the facility forming at least one via (e.g., the vias 226, 230) intersecting the core. In this case, disposing the second insulating material below the core at block 315 may involve electrically coupling the second metal pattern to the at least one via and to at least one terminal of at least one of the one or more passive components.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. An embedded trace substrate, comprising:
a core;
a first insulating material disposed above the core and having a first metal layer embedded therein, the first metal layer having a first plurality of traces arranged in a first metal pattern, wherein the first insulating material is disposed between features of the first metal pattern in the first metal layer;
a second insulating material disposed below the core and having a second metal layer embedded therein, the second metal layer having a second plurality of traces arranged in a second metal pattern; and
one or more passive components embedded in the core.

2. The embedded trace substrate of claim 1, wherein at least one of the one or more passive components is electrically coupled to at least one of the first metal pattern or the second metal pattern.

3. The embedded trace substrate of claim 1, wherein the core comprises a copper clad laminate.

4. The embedded trace substrate of claim 1, wherein the core comprises woven glass.

5. The embedded trace substrate of claim 1, wherein at least one of:
the first metal layer with the first metal pattern is laminated to the core using the first insulating material; or
the second metal layer with the second metal pattern is laminated to the core using the second insulating material.

6. The embedded trace substrate of claim 1, wherein a thickness of the core is in a range between 30 and 100 μm inclusive.

7. The embedded trace substrate of claim 1, wherein the one or more passive components comprise a multilayer ceramic capacitor.

8. The embedded trace substrate of claim 1, wherein at least one of the first insulating material or the second insulating material comprises a preimpregnated material.

9. The embedded trace substrate of claim 1, further comprising one or more vias intersecting the core and electrically coupling the first metal pattern to the second metal pattern.

10. The embedded trace substrate of claim 1, further comprising one or more additional layers of insulating material disposed below the second metal layer, each having a different additional metal layer embedded therein.

11. The embedded trace substrate of claim 1, further comprising a third layer of insulating material disposed below the second metal layer, wherein the third layer of insulating material has a third metal layer embedded therein.

12. The embedded trace substrate of claim 1, wherein at least one of the passive components has a first terminal electrically coupled to the second metal pattern and a second terminal electrically coupled to the second metal pattern.

13. The embedded trace substrate of claim 12, wherein the first terminal of the at least one of the passive components is coupled to the first metal pattern through a via intersecting the core and electrically coupled to the first metal pattern and the second metal pattern.

14. A package assembly comprising the embedded trace substrate of claim 1, the package assembly further comprising an integrated circuit (IC) die disposed above and coupled to the embedded trace substrate.

15. The package assembly of claim 14, wherein the IC die comprises a plurality of conductive pillars or conductive balls electrically coupled to the first metal pattern of the embedded trace substrate.

16. The embedded trace substrate of claim 1, wherein the second insulating material is disposed between features of the second metal pattern in the second metal layer.

* * * * *